United States Patent
Huang et al.

(10) Patent No.: US 11,984,422 B2
(45) Date of Patent: May 14, 2024

(54) SEMICONDUCTOR PACKAGE AND METHOD OF FORMING SAME

(71) Applicant: Taiwan Semiconductor Manufacturing Co., Ltd., Hsinchu (TW)

(72) Inventors: Li-Hsien Huang, Zhubei (TW); Yao-Chun Chuang, Hsinchu (TW); SyuFong Li, Taoyuan (TW); Ching-Pin Lin, Hsinchu (TW); Jun He, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 131 days.

(21) Appl. No.: 17/678,774

(22) Filed: Feb. 23, 2022

(65) Prior Publication Data
US 2023/0045422 A1    Feb. 9, 2023

Related U.S. Application Data

(60) Provisional application No. 63/230,117, filed on Aug. 6, 2021.

(51) Int. Cl.
| | |
|---|---|
| *H01L 21/683* | (2006.01) |
| *H01L 21/66* | (2006.01) |
| *H01L 23/00* | (2006.01) |
| *H01L 23/48* | (2006.01) |

(52) U.S. Cl.
CPC .......... *H01L 24/27* (2013.01); *H01L 21/6835* (2013.01); *H01L 22/14* (2013.01); *H01L 23/481* (2013.01); *H01L 24/03* (2013.01); *H01L 24/05* (2013.01); *H01L 24/06* (2013.01); *H01L 24/30* (2013.01); *H01L 2224/0384* (2013.01); *H01L 2224/0401* (2013.01); *H01L 2224/05624* (2013.01); *H01L 2224/06515* (2013.01); *H01L 2224/275* (2013.01); *H01L 2224/30181* (2013.01); *H01L 2924/30105* (2013.01);

(Continued)

(58) Field of Classification Search
CPC .... H01L 24/27; H01L 21/6835; H01L 23/481
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

In an embodiment, a method includes attaching a first package component to a first carrier, the first package component comprising: an aluminum pad disposed adjacent to a substrate; a sacrificial pad disposed adjacent to the substrate, the sacrificial pad comprising a major surface opposite the substrate, a protrusion of the sacrificial pad extending from the major surface; and a dielectric bond layer disposed around the aluminum pad and the sacrificial pad; attaching a second carrier to the first package component and the first carrier, the first package component being interposed between the first carrier and the second carrier; removing the first carrier; planarizing the dielectric bond layer to comprise a top surface being coplanar with the protrusion; and etching a portion of the protrusion.

20 Claims, 14 Drawing Sheets

(52) U.S. Cl.
CPC ............... *H01L 2924/35121* (2013.01); *H01L 2924/37001* (2013.01)

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,768,048 B2 * | 9/2017 | Lin ........................ H01L 21/563 |
| 2015/0303174 A1 * | 10/2015 | Yu ........................... H01L 24/19 |
| | | 438/109 |

* cited by examiner

US 11,984,422 B2

SEMICONDUCTOR PACKAGE AND METHOD OF FORMING SAME

PRIORITY CLAIM AND CROSS-REFERENCE

This application claims the benefit of the following provisionally filed U.S. Patent application: Application No. 63/230,117, filed on Aug. 6, 2021, and entitled "Innovative SoIC Integration Flow for Robust Reliability Performances," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
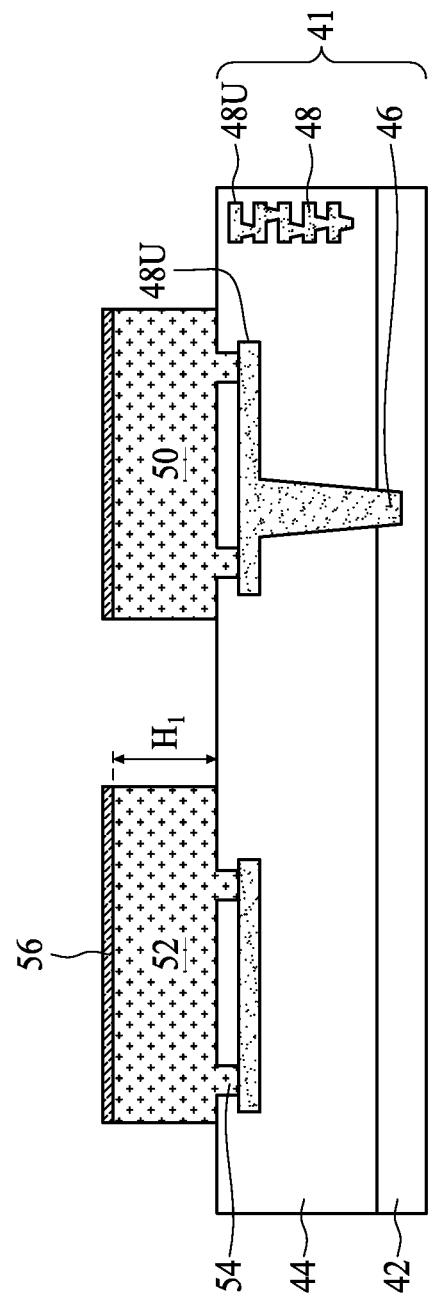
FIGS. 1-5, 6A, 6B, 7A, 7B, and 8-12 illustrate cross-sectional views of intermediate stages in the formation of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of forming the same are provided. In accordance with some embodiments of the present disclosure, a first package component is formed in a wafer and comprises an integrated circuit, through-silicon vias, and aluminum pads. Some of the aluminum pads that are electrically connected to the integrated circuit are used for circuit probe testing to determine known good dies (KGDs) within the wafer. A recess and a protrusion may be formed in the aluminum pads as a result of the circuit probe testing. After encapsulating the aluminum pads in a dielectric bond layer, the KGDs may be singulated, flipped, and attached to a first wafer. One or more other package components may then be attached and connected to the first package component, and the structure may then be flipped for subsequent processing (e.g., formation of conductive connectors). For example, the first carrier is removed, and the dielectric bond layer of the first package component is planarized. The planarization may reach protrusions of the aluminum pads, which may result in a smearing of the protrusions (e.g., a conductive material) over the dielectric bond layer. As such, an etch process may be utilized to remove the smeared portion of the protrusion from atop the dielectric bond layer as well as etching down any exposed protrusions. Dielectric layers may then be formed over the dielectric bond layer, and conductive connectors may be formed through those dielectric layers for connection to others of the aluminum pads. The removal of the smeared portion and reduction in the height of the protrusion improve reliability and yield of the semiconductor package during subsequent processing, which can reduce manufacturing costs. In addition, the removal and reduction will improve reliability of the completed semiconductor package during functional use.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-5, 6A-7B, and 8-12 illustrate the cross-sectional views and perspective views of intermediate stages in the fabrication process of a semiconductor package, including wafer acceptance testing (WAT) and process control monitoring (PCM) processes as well as subsequent steps in the fabrication process to further increase efficiency and improve quality.

In FIG. 1, a first package component 40 is formed, for example, in a wafer (not separately illustrated). In accordance with some embodiments, first package components 40 are individual device dies, packages having one or more device dies packaged therein, System-on-Chip (SoC) dies including a plurality of integrated circuits (or device dies) integrated as a system, or the like. The device die(s) in first package components 40 may be or may comprise logic dies, memory dies, input-output dies, Integrated Passive Devices (IPDs), the like, or combinations thereof. For example, the logic device die(s) in first package components 40 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory die(s) in first package components 40 may include Static Random Access Memory (SRAM) dies, Dynamic Random Access Memory (DRAM) dies, or the like. The device die(s) in first package components 40 may include semiconductor substrates and interconnect structures.

In accordance with some embodiments, first package component 40 may include a substrate 41 comprising a semiconductor substrate 42 (e.g., a silicon substrate), integrated circuit devices (not separately illustrated) at a frontside surface of semiconductor substrate 42, a plurality of dielectric layers 44 formed over semiconductor substrate 42 and the integrated circuit devices. The integrated circuit devices may include active devices, passive devices, and the like. Substrate 41 of first package component 40 further includes through-silicon vias (TSVs) 46 and an interconnect structure 48. In some embodiments, the interconnect structure 48 may include a seal ring, for example, such as an outer perimeter of conductive elements embedded in the plurality of dielectric layers 44. For example, the outer perimeter of these conductive elements may be electrically disconnected from the rest of the interconnect structure 48 and the integrated circuit devices. TSVs 46 may extend partially through semiconductor substrate 42 as well as partially through plurality of dielectric layers 44.

Interconnect structure 48 is disposed over the front-side of the semiconductor substrate 42 and embedded in plurality of dielectric layers 44. Interconnect structure 48 includes metal lines and vias electrically connected to the integrated circuit devices. As illustrated, interconnect structure 48 includes a plurality of levels of the metal lines, wherein one or more levels of upper metal lines 48U may be coupled with corresponding ones of TSVs 46.

Metal pads 50/52, including aluminum pads 50 and sacrificial pads 52, are disposed over substrate 41 (e.g., over plurality of dielectric layers 44) and electrically connected to upper metal lines 48U of interconnect structure 48 by conductive vias 54. Aluminum pads 50 will help provide external electrical connection during functional use of first package components 40, and sacrificial pads 52 will provide external electrical connection during circuit probe testing of first package components (see FIG. 2). Aluminum pads 50 and sacrificial pads 52 may have the same compositions, such as comprising aluminum, an aluminum-copper alloy (e.g., comprising up to 1% copper by volume), or any suitable material. Aluminum pads 50 and sacrificial pads 52 may each have heights $H_1$ over substrate 41 in a range from 1.2 µm to 3.0 µm. Metal pads 50/52 may be coated with a dielectric layer 56 for protection, such as from oxidation. For example, the dielectric layer 56 may be an anti-reflective coating (ARC) and comprise an oxide or a nitride, such as silicon oxynitride (SiON), silicon carbide (SiC), or any suitable material.

In some embodiments, aluminum pads 50 and sacrificial pads 52 (e.g., metal pads 50/52) are formed simultaneously over substrate 41. For example, a sacrificial material (not shown) may first be formed over substrate 41. Openings are formed in the sacrificial material by first applying a photoresist over a top surface of the sacrificial material and patterned using a photolithographic mask. The patterned photoresist is then used as an etching mask to etch openings in the sacrificial material and expose portions of substrate 41 (e.g., conductive vias 54). To form the openings, the sacrificial material may be etched by a suitable process such as dry etching (e.g., reactive ion etching (RIE) or neutral beam etching (NBE), etc.), wet etching, or the like. In other embodiments, the sacrificial material itself is the photoresist, and an energy source (e.g., ultraviolet light) is shined through the photomask to change chemical properties (e.g., solubility) of regions of the sacrificial material impinged by the energy. To form the openings, those regions of the sacrificial material may be etched by a suitable process such as an isotropic wet etch process.

The openings within the sacrificial material are filled with a conductive material to form pads 50/52. In an embodiment, the conductive material may comprise a seed layer and a plate metal (not separately illustrated). The seed layer may be blanket deposited over the exposed top surfaces of substrate 41, and may comprise, for example, a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise aluminum, an aluminum-copper alloy, or the like. In some embodiments, the sacrificial material and pads 50/52 may be planarized, for example, using a chemical mechanical polish (CMP) or a grinding process. The photoresist, the sacrificial material, and portions of the seed layer on which the conductive material is not formed are removed. The photoresist and/or the sacrificial material may be removed by one or more acceptable ashing or stripping processes, such as using an oxygen plasma or the like. Afterward, exposed portions of the seed layer are removed, such as by using an acceptable etching process. The remaining portions of the conductive material (e.g., the seed layer and the plate metal) form pads 50/52.

Although only one aluminum pad 50 and one sacrificial pad 52 are illustrated, it should be appreciated that each first package component 40 includes a plurality of each type of metal pad 50/52. Some aluminum pads 50 may be connected to TSVs 46 by upper metal lines 48U. Some aluminum pads 50 may be connected to the integrated circuit devices at the surface of semiconductor substrate 42 by interconnect structure 48. In addition, some sacrificial pads 52 may be connected to corresponding aluminum pads 50 that are connected to the integrated circuit devices through upper metal lines 48U of interconnect structure 48.

Figure 2:
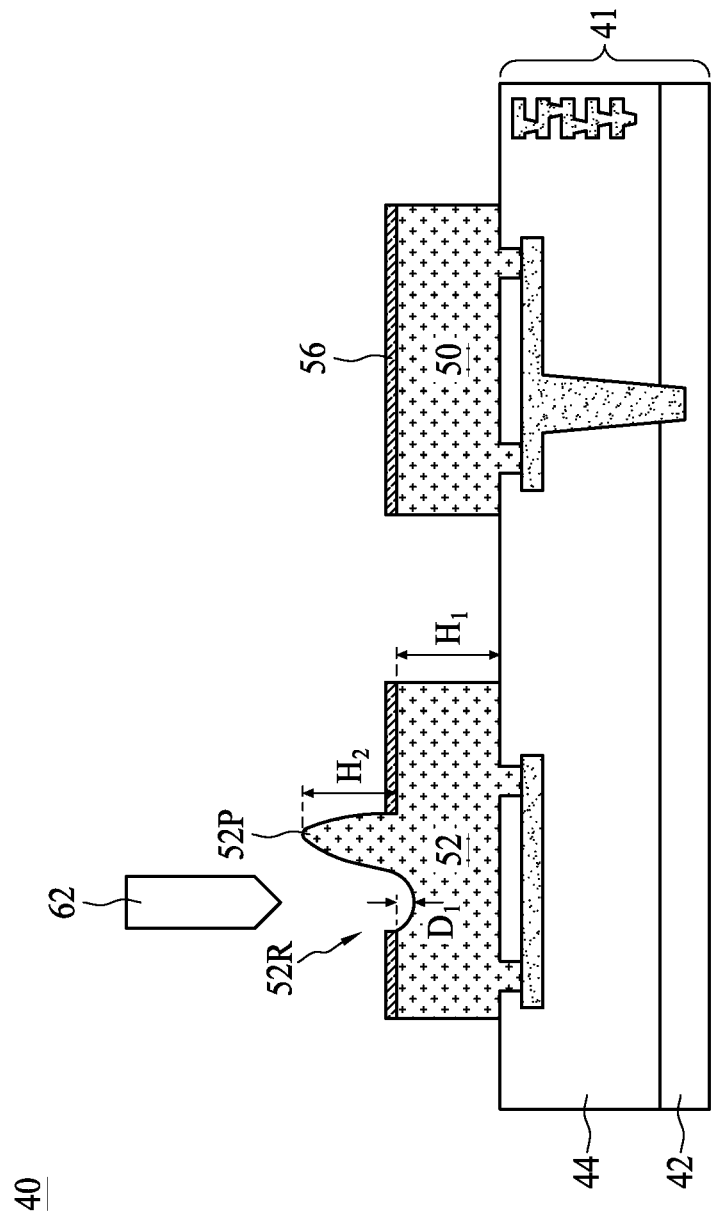

In FIG. 2, a first wafer acceptance testing (WAT) processing, such as circuit probe testing, is performed on first package components 40 to ascertain whether first package components 40 are known good dies (KGDs). First package components 40 may be tested using one or more probes 62. Probes 62 are physically and electrically coupled to sacrificial pads 52 by, e.g., reflowable test connectors. Although not specifically illustrated, more than one probe 62 (e.g., two probes 62) may be coupled to corresponding sacrificial pads 52 (e.g., two sacrificial pads 52). Only wafers with first package components 40 which are KGDs undergo subsequent processing and packaging, and wafers with first package components 40 which fail the circuit probe testing are not subsequently processed and packaged. The testing may include providing power, ground, and signal voltages to sacrificial pads 52 in order to test the functionality of the various first package components 40 (e.g., the integrated circuit devices and interconnect structure 48 within). In some embodiments, the circuit probe testing may include testing for known open or short circuits that may be expected based on the design of the integrated circuits within the first package components 40. In some embodiments, after testing is complete, probe 62 is removed and any excess reflowable material on the sacrificial pads 52 may be removed by, e.g., an etching process, a chemical-mechanical polish (CMP), a grinding process, or the like.

As discussed above, ones of sacrificial pads 52 undergoing the circuit probe testing may be electrically connected through interconnect structure 48 to the integrated circuit devices located at the semiconductor substrate 42. Upper metal lines 48U of interconnect structure may electrically connect ones of aluminum pads 50 to these ones of sacrificial pads 52. As such, these ones of sacrificial pads 52 are electrically connected to the integrated circuit devices for the circuit probe testing, while these ones of aluminum pads 50 are similarly electrically connected to the integrated circuit devices for the functional use of the completed semiconductor package.

As illustrated, the circuit probe testing may result in deformation of sacrificial pads 52, for example, forming probe marks in sacrificial pads 52. For example, probe marks may include a recess 52R (e.g., caused by physical contact from probe 62) and a protrusion 52P (e.g., caused by displacement of material of sacrificial pad 52 by the physical contact from probe 62) in the corresponding sacrificial pad 52. Consequently, recess 52R may have a depth $D_1$ of up to 1.1 μm. In addition, protrusion 52P indicates vertical displacement of material of sacrificial pad 52 to a height $H_2$ above a top major surface of sacrificial pad 52 being up to 1.2 μm, while being less than height $H_1$. In addition, the circuit probe testing may result in portions of dielectric layer 56 located at recess 52R and protrusion 52P of sacrificial pad 52 being displaced or removed, while dielectric layer 56 remains over other portions of sacrificial pad 52 and over aluminum pad 50.

Figure 3:
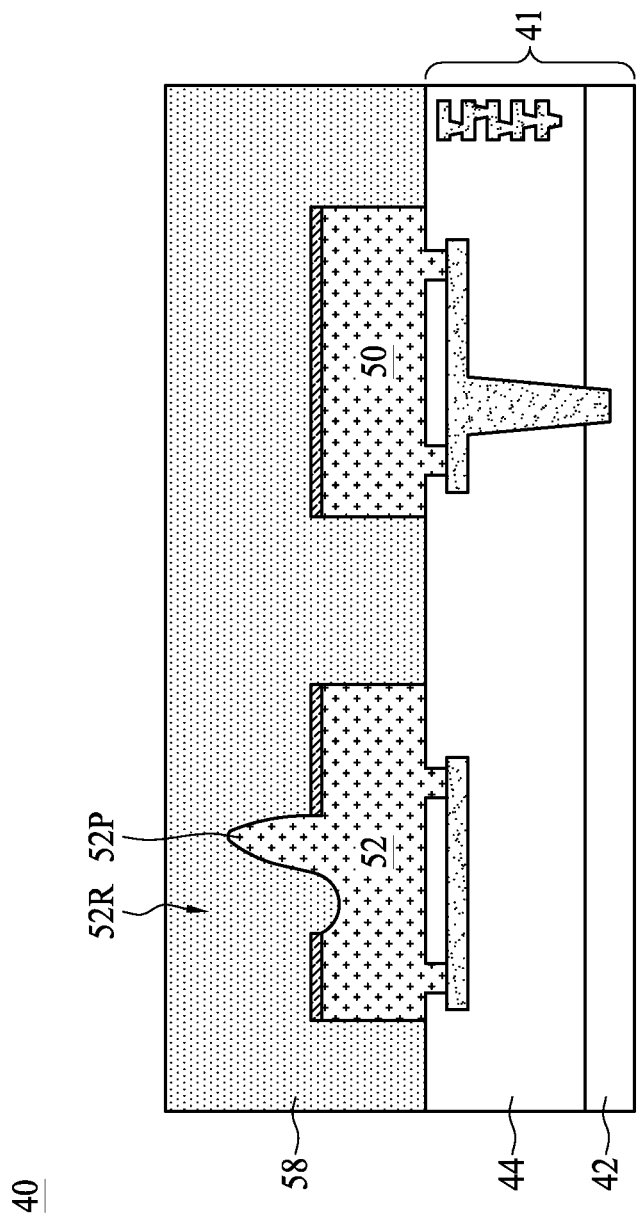

In FIG. 3, a dielectric bond layer 58 is formed over aluminum pad 50 and sacrificial pad 52 of first package component 40. Dielectric bond layer 58 may be a single homogenous layer or a composite of two or more layers comprising, for example, an oxide and/or a nitride, such as silicon oxide ($SiO_2$), silicon oxynitride (SiON), silicon nitride (SiN), the like, or any suitable material(s). Dielectric bond layer 58 may be formed using spin coating, Flowable Chemical Vapor Deposition (FCVD), or the like. Dielectric bond layer 58 is formed to have a top surface above an entirety of protrusion 52P of sacrificial pad 52. In accordance with some embodiments, after forming dielectric bond layer 58, individual first package components 40 are singulated from the wafer, using any suitable sawing process, in order for the KGDs of first package components 40 to undergo subsequent processing and packaging as discussed below.

Figure 4:
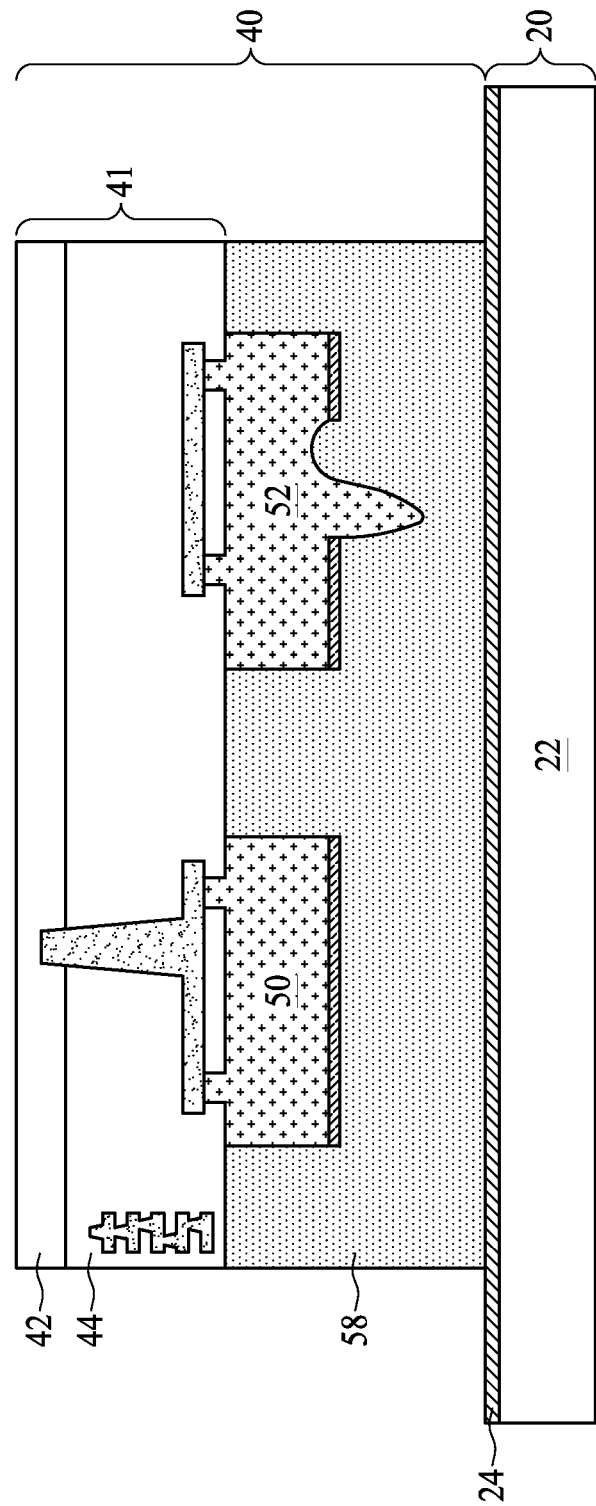

In FIG. 4, singulated first package components 40 are bonded to a first carrier 20 through an oxide-oxide bonding process, such as fusion bonding. Although one first package component 40 is illustrated, there may be a plurality of first package components 40 (e.g., KGDs) bonded to first carrier 20. The plurality of first package components 40 may be discrete package components physically separate from each other, and the bonding process is a die-to-wafer bonding. In embodiments not illustrated in which first package components 40 are not first singulated, first package components 40 may be within the un-sawed wafer, and the bonding process is a wafer-to-wafer bonding.

First carrier 20 includes a base carrier 22 and one or more dielectric bond layers 24. In some embodiments, base carrier 22 may be a wafer, and may be formed of a same material as semiconductor substrate 42 in the overlying first package component 40, so that in the subsequent packaging process, warpage caused by mismatch of Coefficients of Thermal Expansion (CTE) is reduced. For example, base carrier 22 may be formed of or comprise silicon, while other materials such as laminate, ceramic, glass, silicate glass, or the like, may also be used. In accordance with some embodiments, the entire base carrier 22 is formed of a homogeneous material, with no other material different from the homogeneous material therein. For example, the entire base carrier 22 may be formed of silicon (doped or undoped), and without a metal region, dielectric region, etc., therein.

Before attaching first package components 40 to first carrier 20, dielectric bond layers 24 are deposited on base carrier 22. Dielectric bond layers 24 may include oxide based materials (which may also be silicon oxide based) such as silicon oxide (SiO), phospho-silicate glass (PSG), borosilicate glass (BSG), boron-doped phospho silicate glass (BPSG), fluorine-doped silicate glass (FSG), nitride-based materials such as silicon nitride (SiN), oxynitride based materials such as silicon oxynitride (SiON), while it may also be formed of or comprises other materials such as silicon oxycarbide (SiOC), silicon carbonitride (SiCN), or the like. Dielectric bond layers 24 may be formed using spin coating, FCVD, Plasma Enhanced Chemical Vapor Deposition (PECVD), Low Pressure Chemical Vapor Deposition (LPCVD), Atomic Layer Deposition (ALD), the like, or combinations thereof. For example, in some embodiments, dielectric bond layers 24 may include a lowermost layer (e.g., proximal to base carrier 22) comprising an oxide, one or more middle layers comprising a nitride and/or an oxynitride, and an uppermost layer (e.g., distal from base carrier 22) comprising an oxynitride (e.g., with a lower nitrogen-to-oxygen ratio as compared with the middle layers). Although not specifically illustrated, alignment marks may be formed in dielectric bonding layers 24 (e.g., the uppermost layer) using any suitable method.

In accordance with some embodiments, the bonding of first package components 40 to first carrier 20 includes pre-treating dielectric bond layers 24 and 58 in a process gas comprising oxygen ($O_2$) and/or nitrogen ($N_2$), performing a pre-bonding process to join dielectric bond layers 24 and 58 together, and performing an annealing process following the pre-bonding process. In accordance with some embodiments, during the pre-bonding process, first package components 40 are put into contact with first carrier 20, with a pressing force applied to press first package components 40 against first carrier 20. The pre-bonding may be performed at room temperature (in a range from 20° C. to 25° C.), and a higher temperature may also be used.

After the pre-bonding, an annealing process is performed. Chemical bonds, such as Si—O—Si bonds, may be formed between dielectric bond layers 24 and 58, so that dielectric bond layers 24 and 58 are bonded to each other with high bonding strength. In accordance with some embodiments, the annealing process is performed at a temperature in a range from 200° C. to 400° C. The annealing duration may be in a range from 30 minutes to 60 minutes.

Figure 5:
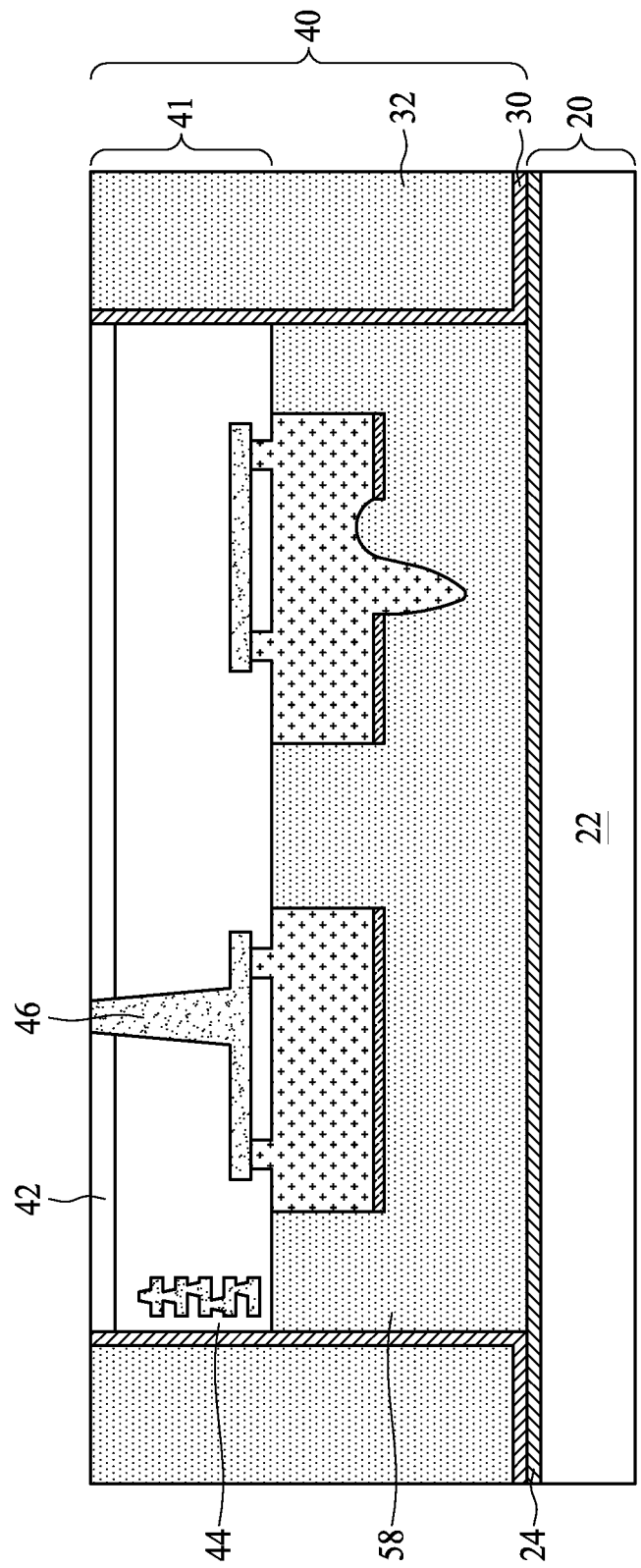

In FIG. 5, after attaching first package components 40 to first carrier 20, liner layer 30 and gap-filling material 32 are formed over first package components 40 and first carrier 20 to encapsulate first package components 40. Liner layer 30 may be a conformal layer extending along the top surfaces and the sidewalls of first package components 40 and along top surfaces of dielectric bond layer 24. Liner layer 30 may also be referred to as a moisture stop layer and, in some embodiments, used as an etch stop layer in subsequent steps. Liner layer 30 may be formed of a dielectric material that has good adhesion to the sidewalls of first package components 40. For example, liner layer 30 may be formed of an extra low-k (ELK) material, including a nitride such as silicon nitride and/or an oxide such as silicon oxide. The deposition of liner layer 30 may include a conformal deposition process such as ALD, CVD, or any suitable process. Gap-filling material 32 may be formed of a molding compound, an epoxy, a resin, and/or the like. For example, gap-filling material 32 may comprise a nitride such as silicon nitride and/or an oxide such as silicon oxide and may be deposited using spin coating, FCVD, PECVD, LPCVD, ALD, or any suitable process.

A planarization process such as a CMP process and/or a mechanical grinding process is then performed to remove portions of liner layer 30 and gap-filling material 32 from over the back-side surface (the illustrated top surface) of first package components 40. The planarization process may continue in order to thin portions of semiconductor substrate 42 until TSVs 46 are exposed. After the planarization process, semiconductor substrate 42 may be coplanar (within process variations) with top surfaces of liner layer 30 and gap-filling material 32.

Figure 6A:
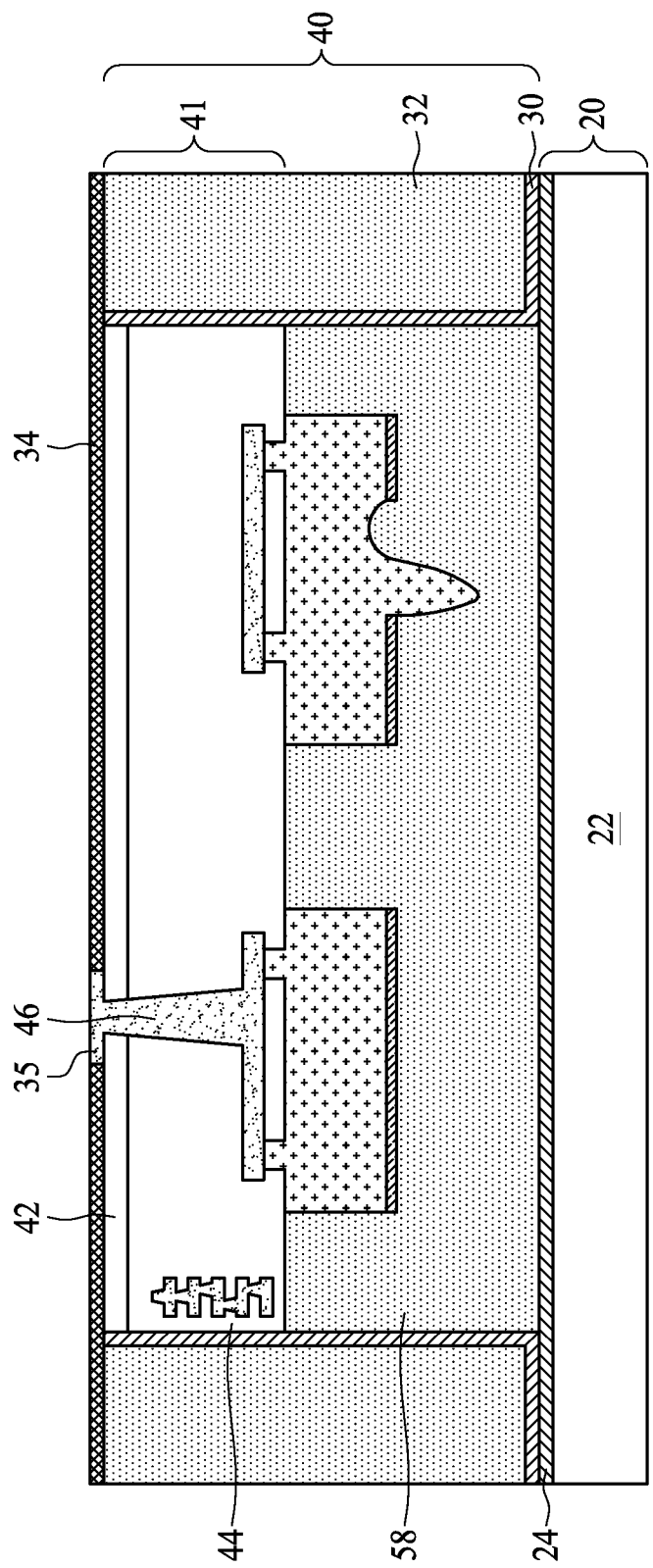
Figure 6B:
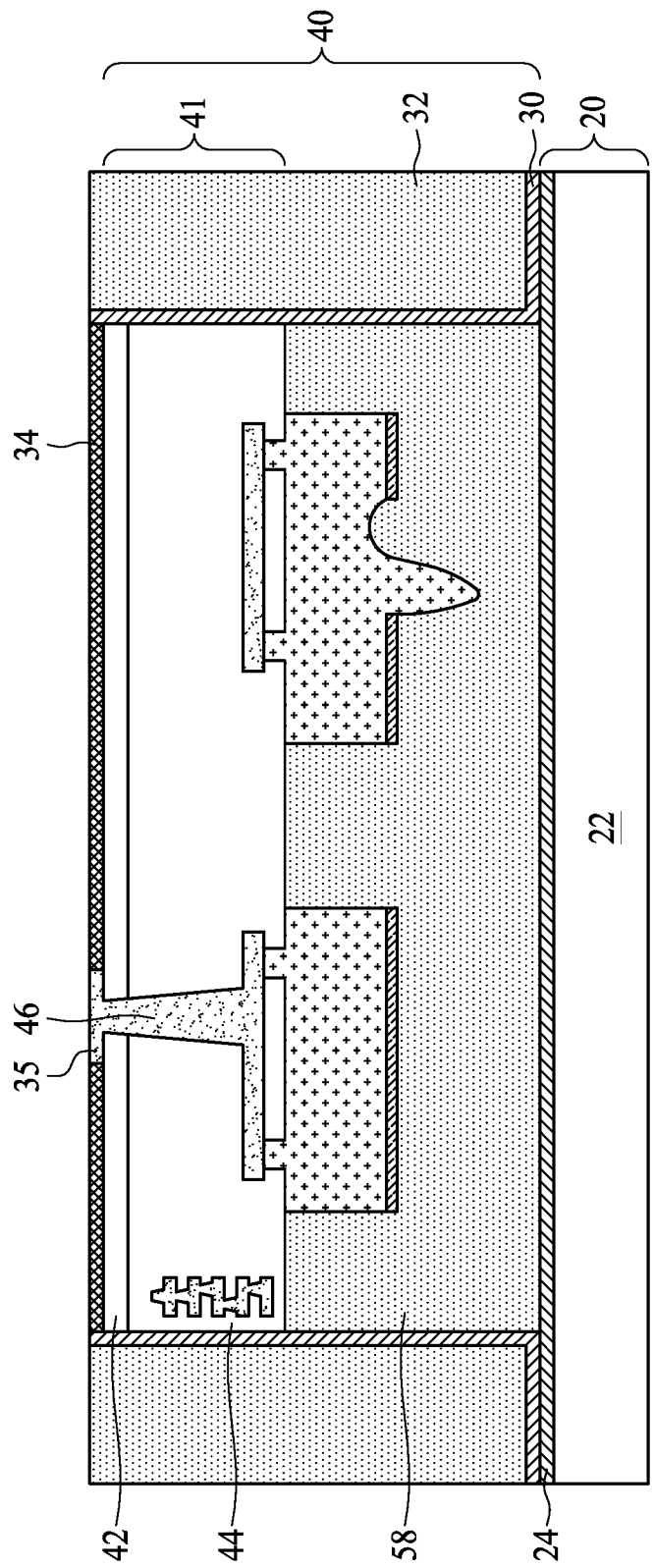

In FIGS. 6A and 6B, dielectric bond layer 34 and bond pads 35 are formed over the back-side surface of first package component 40 (e.g., the back-side surface of semiconductor substrate 42). In some embodiments, dielectric bond layer 34 may be first deposited using any suitable method such as ALD, CVD, or the like. Dielectric bond layer 34 is then patterned to form openings, which are filled with a conductive material to form bond pads 35, similarly as described above in connection with metal pads 50/52.

FIG. 6B illustrates an embodiment in which dielectric bond layer 34 and bond pads 35 are formed over semiconductor substrate 42 and TSVs 46 before forming liner layer 30 and gap-filling material 32. In some such embodiments, dielectric bond layer 34 and bond pads 35 may be formed before singulating and attaching first package components 40 to first carrier 20 (see FIG. 4). As such, dielectric bond layer 34 and bond pads 35 may be considered part of first package components 40. After forming liner layer 30 and gap-filling material 32, a planarization process such as a CMP process and/or a mechanical grinding process is performed to remove portions of liner layer 30 and gap-filling material 32 from over the back-side surface of first package components 40. The planarization process may continue until bond pads 35 and dielectric bond layer 34 are exposed. As illustrated, after performing the planarization process, liner layer 30 and gap-filling material 32 may be coplanar (within process variations) with dielectric bond layer 34 and bond pads 35.

Figure 7A:
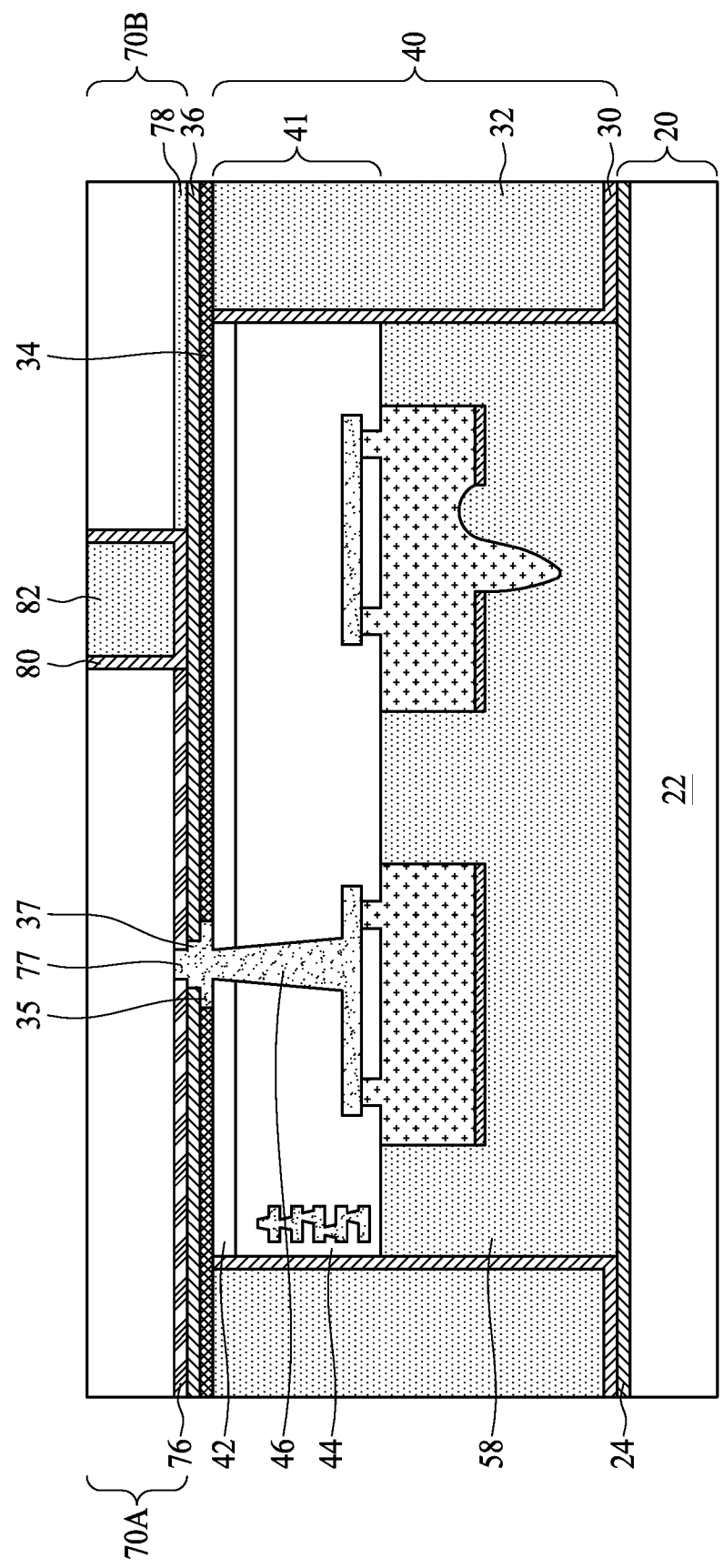
Figure 7B:
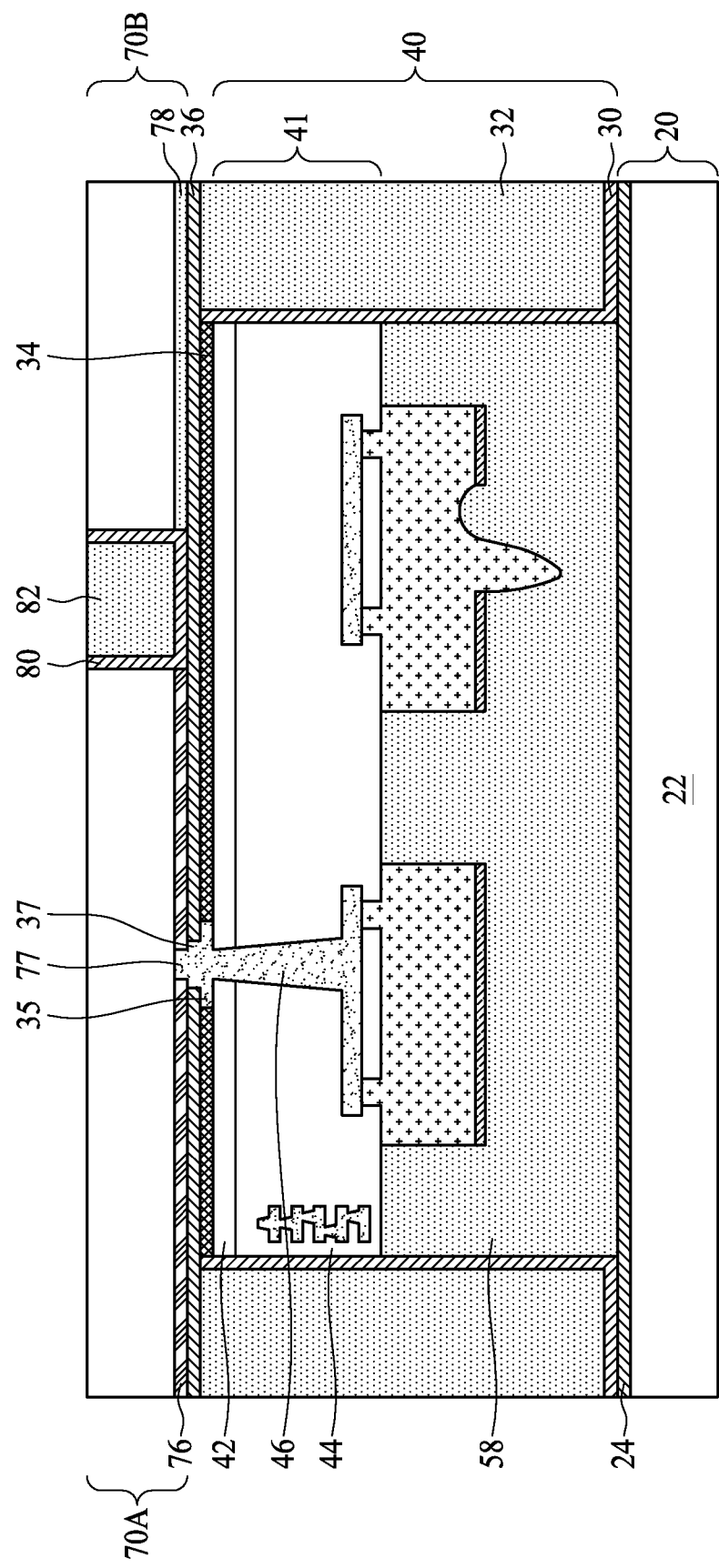

In FIGS. 7A-7B, second package components 70 are attached to first package components 40. FIG. 7A illustrates the attachment to the structure illustrated in FIG. 6A, and FIG. 7B illustrates the attachment to the structure illustrated in FIG. 6B. Notably, subsequent figures illustrate the subsequent processing steps performed on the structure of FIG. 7A, however, a person of ordinary skill in the art would understand how those subsequent processing steps would also apply to the structure of FIG. 7B.

Second package components 70 may include second package components 70A comprising integrated circuits and second package components 70B serving as dummy package components. For example, second package components 70A may be attached through a hybrid bonding process, and second package components 70B may be attached through an oxide-oxide bonding process, such as fusion bonding. Although one of second package components 70A and one of second package components 70B are illustrated, there may be a plurality of second package components 70A and/or a plurality of second package components 70B attached to first package component 40. The plurality of second package components 70A/B may be discrete package components physically separate from each other (e.g., singulated from their respective wafers).

In accordance with some embodiments, second package components 70A may be the same as, similar to, or different from first package components 40. For example, second package components 70A are individual device dies, packages having one or more device dies packaged therein, System-on-Chip (SoC) dies including a plurality of integrated circuits (or device dies) integrated as a system, or the like. The device die(s) in second package components 70A may be or may comprise logic dies, memory dies, input-output dies, Integrated Passive Devices (IPDs), the like, or combinations thereof. For example, the logic device die(s) in second package components 70A may be Central Processing Unit (CPU) dies, Graphic Processing Unit (GPU) dies, mobile application dies, Micro Control Unit (MCU) dies, BaseBand (BB) dies, Application processor (AP) dies, or the like. The memory die(s) in second package components 70A may include Static Random Access Memory (SRAM) dies, Dynamic Random Access Memory (DRAM) dies, or the like. The device die(s) in second package components 70A may include semiconductor substrates and interconnect structures.

In accordance with some embodiments not specifically illustrated, second package components 70A may include features similar to those described above in first package components 40. For example, second package components 70A may include a semiconductor substrate, integrated circuit devices, and a plurality of dielectric layers formed over the semiconductor substrate and the integrated circuit devices. The integrated circuit devices may include active devices, passive devices, and the like. Second package components 70A may further include dielectric bond layer 76 with bond pads 77 embedded within.

In accordance with some embodiments, second package components 70B may be dummy package components that do not contribute functional integrated circuits and/or are electrically disconnected from first package components 40 and second package components 70A. Second package components 70A may provide structural support for the semiconductor package as well as heat dissipation from first package components 40 and/or second package components 70A during functional use of the semiconductor package.

Still referring to FIGS. 7A-7B, in some embodiments, before attaching second package components 70A/B to first package components 40, a dielectric bond layer 36 and bond pads 37 may be formed over dielectric bond layer 34 and bond pads 35. Dielectric bond layer 36 and bond pads 37 may be formed similarly as described above in connection with dielectric bond layer 34 and bond pads 35, respectively.

The bonding of second package components 70A to first package components 40 may be achieved through hybrid bonding, in which both of metal-to-metal direct bonding (between bond pads 37 and 77 or between bond pads 37 and 35 if bond pads 37 are formed on second package component 70A before bonding) and dielectric-to-dielectric bonding (such as Si—O—Si bonding between surface dielectric bond layers 36 and 76 or between dielectric bond layers 36 and 34 if dielectric bond layer 36 is formed on second package component 70A before bonding) are formed. Furthermore, there may be a single or a plurality of second package components 70A bonded to the same first package component 40. The plurality of second package components 70A bonded to the same first package component 40 may be identical to, or different from, each other.

In accordance with some embodiments, dielectric bond layer 76 is bonded to the dielectric bond layer 36 through dielectric-to-dielectric bonding, without using any adhesive material (e.g., die attach film). Similarly, the bond pads 77 are bonded to bond pads 37 through metal-to-metal bonding, without using any eutectic material (e.g., solder). The bonding may include a pre-bonding and an annealing. During the pre-bonding, a small pressing force is applied to press second package components 70A against first package components 40. The pre-bonding is performed at a low temperature, such as room temperature, such as a temperature in the range from 15° C. to 30° C., and after the pre-bonding, the dielectric bond layer 76 and dielectric bond layer 36 are bonded to each other. The bonding strength is then improved in a subsequent annealing step, in which dielectric bond layer 76 and dielectric bond layer 36 are annealed at a high temperature, such as a temperature in the range from 100° C. to 450° C. After the annealing, bonds, such as fusion bonds, are formed bonding dielectric bond layer 76 with dielectric bond layer 36. For example, the bonds can be covalent bonds between the material of dielectric bond layer 76 and the material of dielectric bond layer 36. Bond pads 77 and bond pads 37 are connected to each other with a one-to-one correspondence. Bond pads 77 and bond pads 37 may be in physical contact after the pre-bonding, or may expand to be brought into physical contact during the annealing. Further, during the annealing, the material of bond pads 77 (e.g., copper) and the material of bond pads 37 (e.g., copper) intermingles, so that metal-to-metal bonds are also formed. Hence, the resulting bonds between second package components 70A and first package components 40 are hybrid bonds that include both dielectric-to-dielectric bonds and metal-to-metal bonds.

The bonding of second package components 70B to first package components 40 may be performed before, after, or at various points during attachment of second package components 70A. The bonding of second package components 70B is achieved through oxide-oxide bonding, in which dielectric-to-dielectric bonding (such as Si—O—Si bonding between surface dielectric bond layers 36 and 78) is formed. Furthermore, there may be a single or a plurality of second package components 70B bonded to the same first package component 40. The plurality of second package components 70B bonded to the same first package component 40 may be identical to, or different from, each other.

After attaching second package components 70A/B to first package components 40, a liner layer 80 and a gap-filling material 82 are formed over and between second package components 70A/B to encapsulate second package components 70A/B. Liner layer 80 may be a conformal layer extending along the top surfaces and the sidewalls of second package components 70 as well as along top surfaces of dielectric bond layer 36 and may serve as a moisture stop layer. Liner layer 80 is formed of a dielectric material that has good adhesion to the sidewalls of second package components 70. For example, liner layer 80 may be formed of an extra low-k (ELK) material, including a nitride such as silicon nitride and/or an oxide such as silicon oxide. The deposition of liner layer 80 may include a conformal deposition process such as ALD, CVD, or any suitable process. Gap-filling material 82 may be formed of a molding compound, an epoxy, a resin, and/or the like. For example, gap-filling material 82 may comprise a nitride such as silicon nitride and/or an oxide such as silicon oxide. For example, liner layer 80 and gap-filling material 82 may be formed similarly as described above in connection with liner layer 30 and gap-filling material 32, respectively.

Liner layer 80 and gap-filling material 82 may be planarized to become level with top surfaces of second package components 70. For example, a thinning process may be utilized, such as a CMP process, a grinding process, an etch back process, the like, or combinations thereof.

Figure 8:
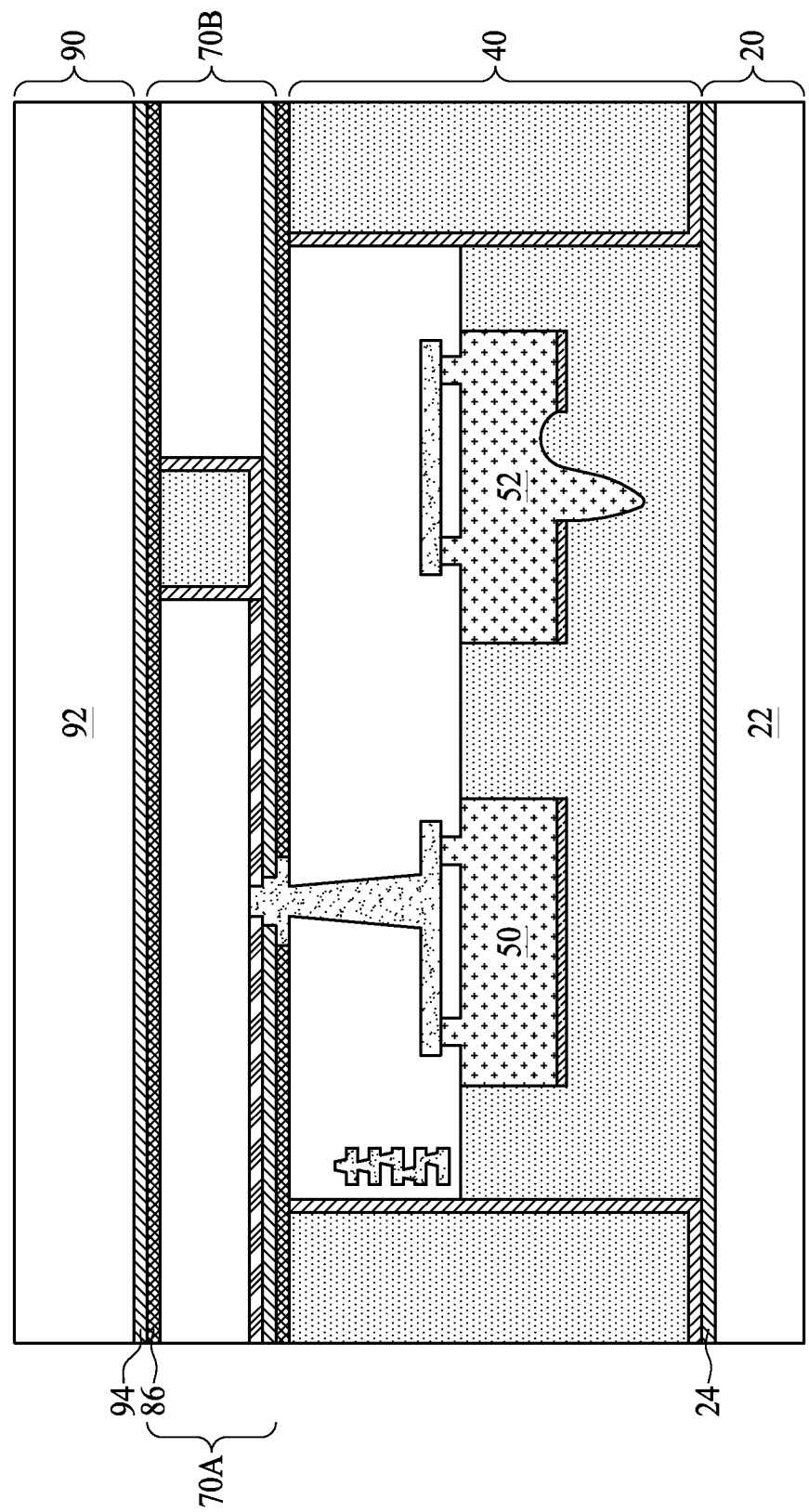

In FIG. 8, a second carrier 90 is bonded to second package components 70 through an oxide-oxide bonding process, such as fusion bonding. Second carrier 90 includes a base carrier 92 and one or more dielectric bond layers 94. Base carrier 92 may be a wafer, and may be formed of a same material as, for example, base carrier 22 in first carrier 20, so that in the subsequent packaging process, the warpage caused by mismatch of Coefficients of Thermal Expansion (CTE) is reduced. In accordance with some embodiments, base carrier 92 may be formed of or comprise silicon, while other materials such as laminate, ceramic, glass, silicate glass, or the like, may also be used. In accordance with some embodiments, the entire base carrier 92 is formed of a homogeneous material, with no other material different from the homogeneous material therein. For example, the entire base carrier 92 may be formed of silicon (doped or undoped), and there is no metal region, dielectric region, etc., therein.

Before attaching second carrier 90 to second package components 70, one or more dielectric bond layers 94 are deposited on base carrier 92 and one or more dielectric bond layers 86 are deposited over second package components 70. Dielectric bond layers 86 and 94 may be formed similarly as described above in connection with any of dielectric bond layers 24/34/36/76.

In accordance with some embodiments, the bonding of second carrier 90 to second package components 70 includes pre-treating dielectric bond layers 86 and 94 in a process gas comprising oxygen ($O_2$) and/or nitrogen ($N_2$), performing a pre-bonding process to join dielectric bond layers 86 and 94 together, and performing an annealing process following the pre-bonding process. In accordance with some embodiments, during the pre-bonding process, second carrier 90 is put into contact with dielectric bond layers 86, with a pressing force applied to press second carrier 90 against second package components 70. The pre-bonding may be performed at room temperature (in a range from 20° C. to 25° C.), and a higher temperature may also be used.

After the pre-bonding, an annealing process is performed. Chemical bonds, such as Si—O—Si bonds, may be formed between dielectric bond layers 86 and 94, so that dielectric bond layers 86 and 94 are bonded to each other with high bonding strength. In accordance with some embodiments, the annealing process is performed at a temperature in a range from 200° C. to 400° C. The annealing duration may be in a range from 30 minutes to 60 minutes.

Figure 9:
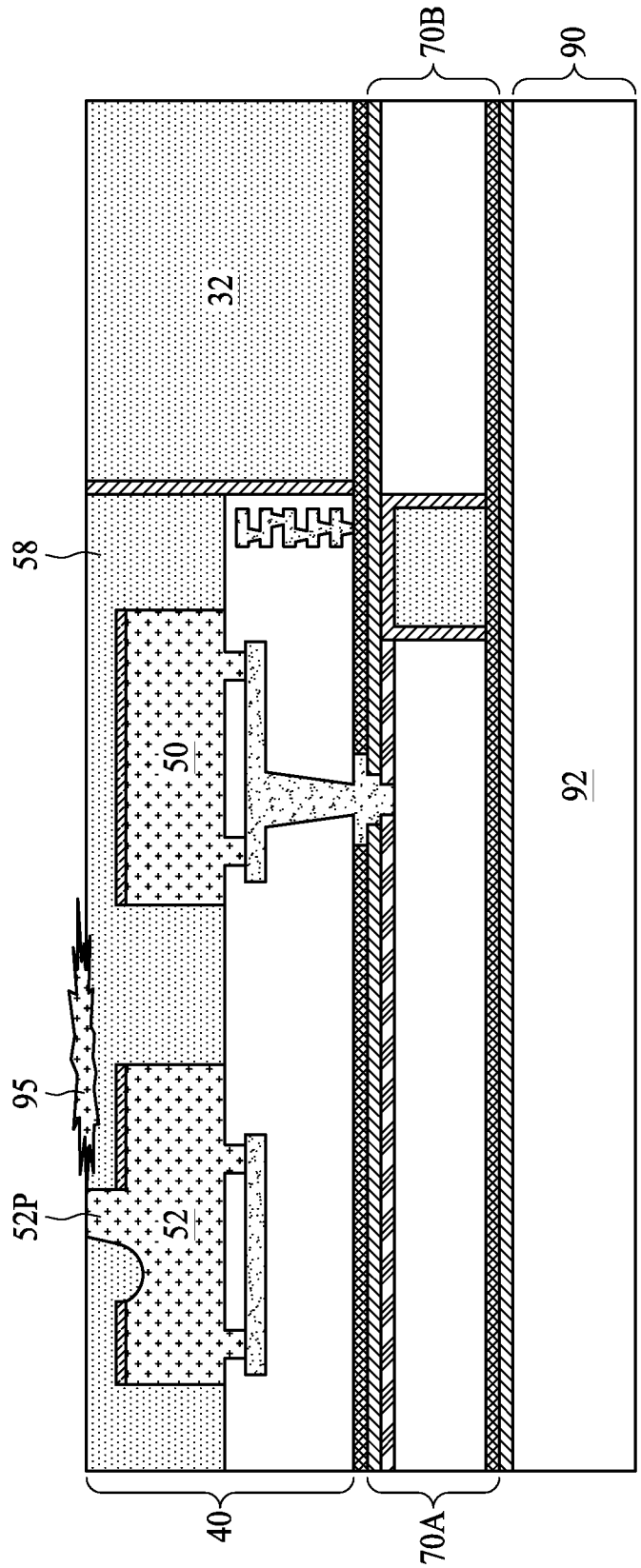

In FIG. 9, the structure may be flipped, first carrier 20 is removed, and dielectric bond layer 58 is exposed. First carrier 20 may be removed using any suitable method, such as a planarization process. The planarization process may continue until dielectric bond layer 58 is coplanar (within process variations) with gap-filling material 32 and liner layer 30. The planarization process may be a CMP process, a grinding process, the like, or a combination thereof. In accordance with some embodiments, the planarization process may form a smeared region 95 due to an upper portion of protrusion 52P smearing over and/or along an upper surface of dielectric bond layer 58. As further illustrated, following the planarization process, a new top surface of protrusion 52P may be level with dielectric bond layer 58, gap-filling material 32, and liner layer 30.

Figure 10:
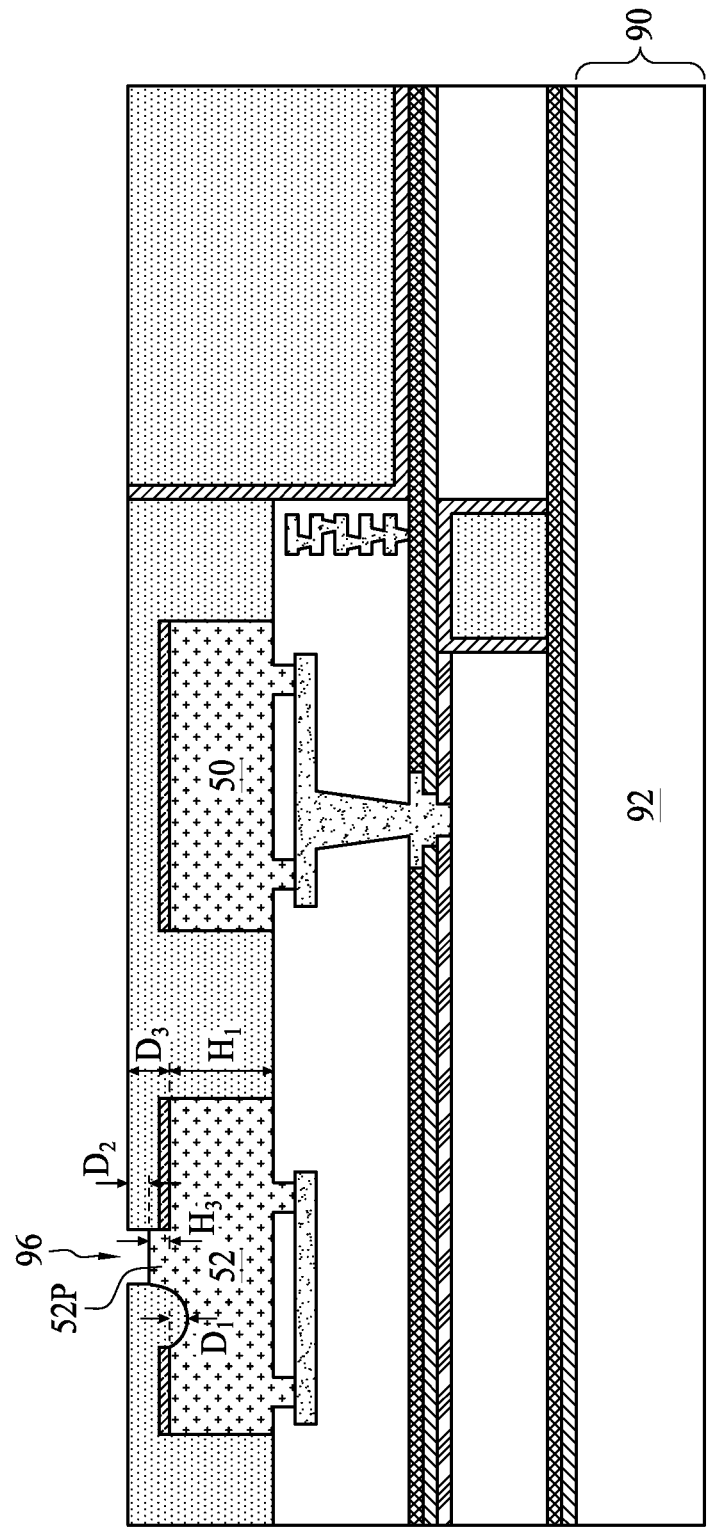

In FIG. 10, a wet etch process is performed to remove smeared region 95 that was formerly the upper portion of protrusion 52P. The wet etch process may be performed using etchants having a high selectivity toward etching the material of sacrificial pad 52 (e.g., aluminum and/or an aluminum-copper alloy) the materials of dielectric bond layer 58, gap-filling material 32, and liner layer 30 remain substantially non-etched and intact. For example, the etch process may be an isotropic wet etch process comprising etchants such as HF, $H_2SO_4/H_2O_2$, $H_2O$, and combinations thereof.

The wet etch process may be performed at standard temperature and pressure for a duration in a range from 15 seconds to 3 minutes. In addition to removing smeared region 95, the wet etch process may also remove a new upper portion of protrusion 52P, thereby forming recess 96 from the top surface of dielectric bond layer 58, wherein recess 96 is directly over protrusion 52P of sacrificial pad 52.

As discussed above, sacrificial pads 52 have top major surfaces with height $H_1$ above substrate 41, and sacrificial pads 52 may have recesses 52R formed during the circuit probe testing (see FIG. 2) with depth $D_1$ measured from the top major surfaces of sacrificial pads 52. However, due to the step of planarizing dielectric bond layer 58 and protrusion 52P (see FIG. 9) followed by the wet etch process performed on protrusion 52P and smeared region 95, protrusion 52P may now have a height $H_3$ above the top major surfaces of sacrificial pads 52. For example, height $H_3$ is less than previous height $H_2$ (as well as height $H_1$ of sacrificial pads 52), such as in a range from 0.2 μm to 1.1 μm. In some embodiments, height $H_3$ of protrusion 52P after etching may be in a range from 6.6% to 91% of height $H_1$ of protrusion 52P before etching.

As further illustrated, an uppermost surface of protrusion 52P may be located at a depth $D_2$ below the top surface of dielectric bond layer 58. By comparison, the top major surfaces of sacrificial pads 52 may be located at a depth $D_3$ below a top surface of dielectric bond layer 58. For example, depth $D_2$ of protrusion 52P below the top surface of dielectric bond layer 58 may be in a range from 0.1 μm to 1.0 μm. Further, depth $D_3$ of top surfaces of sacrificial pads 52 below the top surface of dielectric bond layer 58 may be in a range from 0.4 μm to 1.2 μm.

Figure 11:
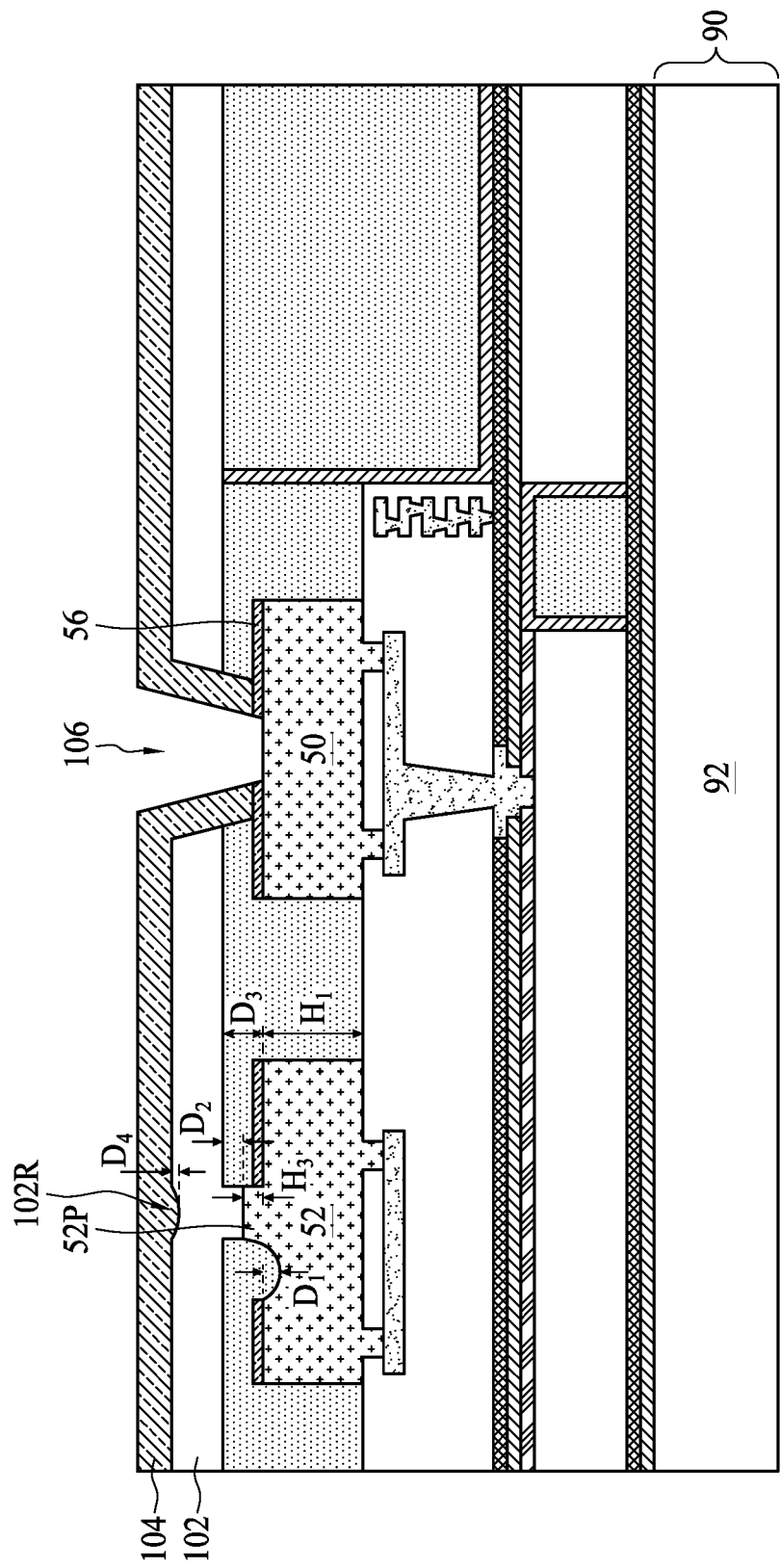

In FIG. 11, a passivation layer 102 and a dielectric layer 104 are formed over aluminum pads 50 and sacrificial pads 52 (e.g., metal pads 50/52). In addition, openings 106 are formed through passivation layer 102, dielectric layer 104, dielectric bond layer 58, and dielectric layer 56 to expose aluminum pads 50. Passivation layer 102 may be a single layer or a plurality of layers and be conformally deposited as an oxide such as silicon oxide, a nitride such as silicon nitride, silicon oxynitride, the like, or combinations thereof. For example, a silicon oxide lower layer (not separately illustrated) may be first deposited over the dielectric bond layer 58 and fill an entirety of recess 96. A silicon nitride upper layer (also not separately illustrated) may then be deposited over the silicon oxide lower layer. The single or plurality of layers comprising passivation layer 102 may be deposited using any suitable method, such as CVD, ALD, combinations thereof, or any suitable methods. Passivation layer 102 forms over dielectric bond layer 58 with improved efficiency and with fewer deficiencies after previously removing smeared region 95. The improved deposition results in a stronger bond between passivation layer 102 and dielectric bond layer 58, thereby reducing risk of delamination during subsequent processing steps.

Passivation layer 102 may be formed to have an average thickness in a range from 2.0 μm to 3.5 μm. In some embodiments, passivation layer 102 (e.g., conformally deposited) may have a top surface containing a recess 102R directly above protrusion 52P of sacrificial pad 52 (e.g., directly above the location of recess 96 formed in connection with FIG. 10). As a result, recess 102R in the top surface of passivation layer may have depth $D_4$ less than depth $D_2$ (e.g., depth $D_4$ is shallower than depth $D_2$), such as in a range from 100 nm to 900 nm. In other embodiments, the top surface of passivation layer 102 may be as level near the portion directly above 102R as in other portions elsewhere.

Passivation layer 102 may then be patterned to form openings 106 through passivation layer 102 and through dielectric bond layer 58. For example, a photoresist may be applied over a top surface of passivation layer 102 and patterned. The patterned photoresist is then used as an etching mask to etch portions of passivation layer 102 in order to form openings 106 and expose dielectric layer 56. Passivation layer 102 may be etched by a suitable process such as dry etching (e.g., reactive ion etching (RIE) or neutral beam etching (NBE), etc.), wet etching, or the like. In some embodiments, the etchants may be selected such that passivation layer 102 and/or dielectric bond layer 58 have high etch selectivities as compared with that for dielectric layer 56, and dielectric layer 56 therefore serves as an etch stop layer during the etching process.

Dielectric layer 104 may be formed of a polymer material such as polyimide, PBO, the like, or any suitable material. Dielectric layer 104 may be conformally deposited using, for example, spin coating, FCVD, PECVD, LPCVD, ALD, the like, or combinations thereof. As illustrated, dielectric layer 104 is formed over the top surface and along exposed sidewalls of passivation layer 102 as well as along exposed sidewalls of dielectric bond layer 58 within openings 106. As such, dielectric layer 104 partially fills and extends entirely across openings 106. A top surface of dielectric layer 104 may be substantially planar, including in a location directly above recess 102R (if present) of passivation layer 102 and directly above protrusion 52P of sacrificial pad 52.

Dielectric layer 104 may then be patterned to re-form openings 106. For example, a photoresist may be applied over a top surface of dielectric layer 104 and patterned. The patterned photoresist is then used as an etching mask to etch dielectric layer 104 and dielectric layer 56 (if still present in openings 106) in order to re-form openings 106 and expose aluminum pads 50. Dielectric layer 104 may be etched by a suitable process such as dry etching (e.g., RIE or NBE, etc.), wet etching, or the like. In embodiments in which dielectric layer 56 was used as an etch stop layer in the prior patterning process, dielectric layer 56 may be etched in the same or a subsequent etching process to expose aluminum pads 50. This patterning process may be performed similarly as described above in connection with the prior patterning process, albeit using etchants selected to etch both dielectric layers 56 and 104.

Figure 12:
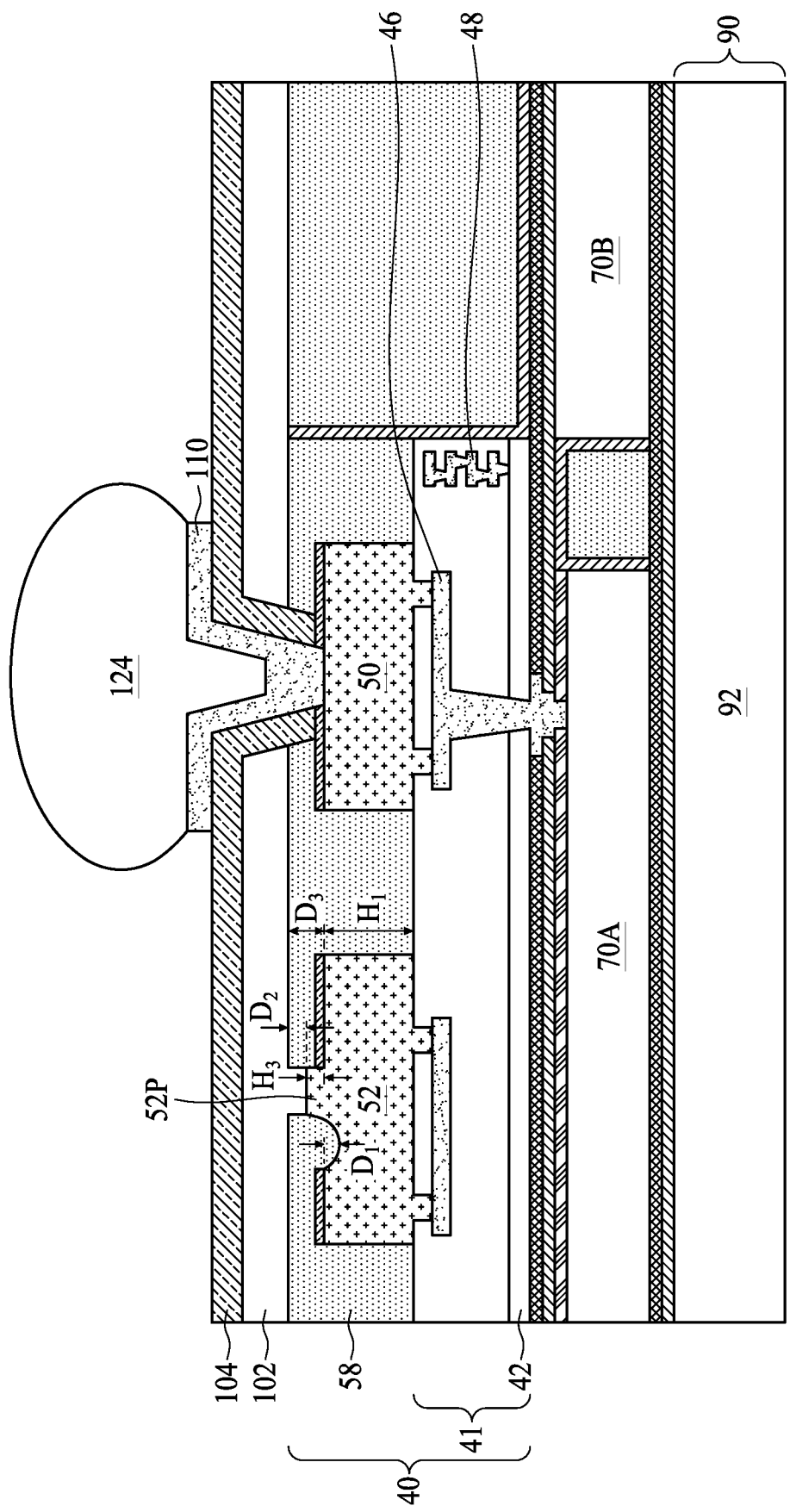

In FIG. 12, under-bump metallurgies (UBMs) 110 and conductive connectors 124 are formed over and through dielectric layer 104 and passivation layer 102 to be electrically connected to aluminum pads 50. As an example to form UBMs 110, a seed layer (not separately illustrated) is formed over the exposed surfaces of aluminum pads 50 and dielectric layer 104. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to UBMs 110. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form UBMs 110.

Conductive connectors 124 are then formed on UBMs 110. Conductive connectors 124 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. Conductive connectors 124 may include a conductive material such as solder, copper, aluminum, gold, nickel, silver, palladium, tin, the like, or a combination thereof. In some embodiments, conductive connectors 124 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, conductive connectors 124 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although not specifically illustrated, the semiconductor package may undergo a second wafer acceptance testing (WAT) process or multiple WAT processes. The second WAT processes may involve subjecting the semiconductor package to extreme conditions (e.g., high temperature, humidity, and/or pressure) while testing functionality of the integrated circuits within. For example, the highly accelerated temperature and humidity stress test (HAST) allows for an accelerated testing of longevity and reliability by being conducted in extreme environmental conditions.

Advantages of the disclosed embodiments may be achieved and, for example, realized during the second WAT processes. In particular, removal of smeared region 95 and/or reducing protrusion 52P before forming UBMs 110 and conductive connectors 124 improve performance of the integrated circuits by minimizing or preventing undesired short circuits and parasitic capacitance. The stronger bonds between passivation layer 102 and dielectric bond layer 58 (e.g., due to removal of smeared region 95) may also improve performance and reliability of the semiconductor package during the second WAT processes as well as functional use.

Although also not specifically illustrated, the semiconductor package may be singulated by sawing through second carrier 90, dielectric layer 104, and layers therebetween. The singulation may be performed before, after, or in between the second WAT processes. Further advantages of the disclosed embodiments may be achieved and, for example, realized during singulation of the semiconductor package. In particular, the stronger bonds between passivation layer 102 and dielectric bond layer 58 due to removal of smeared region 95, which would otherwise be interposed between the layers. As a result, delamination of passivation layer 102 from dielectric bond layer 58 is prevented or reduced during singulation of the semiconductor package. Indeed, delamination is similarly prevented or reduced during any other processing steps that may tend to cause warpage to parts or all of the semiconductor package.

In an embodiment, a method includes attaching a first package component to a first carrier, the first package component comprising: an aluminum pad disposed adjacent to a substrate; a sacrificial pad disposed adjacent to the substrate, the sacrificial pad comprising a major surface opposite the substrate, a protrusion of the sacrificial pad extending from the major surface; and a dielectric bond layer disposed around the aluminum pad and the sacrificial pad; attaching a second carrier to the first package component and the first carrier, the first package component being interposed between the first carrier and the second carrier; removing the first carrier; planarizing the dielectric bond layer to comprise a top surface being coplanar with the protrusion; and etching a portion of the protrusion. In another embodiment, the method further includes, before attaching the first package component: performing a circuit probe test on the first package component, the performing the circuit probe test comprising forming the protrusion of the sacrificial pad; and forming the dielectric bond layer over the protrusion of the sacrificial pad. In another embodiment, the performing the circuit probe test further comprises: electrically connecting a power signal to the sacrificial pad; and forming a first recess in the major surface of the sacrificial pad. In another embodiment, the method further includes, before attaching the second carrier, hybrid bonding a second package component to the first package component. In another embodiment, the method further includes, before attaching the second carrier, oxide-oxide bonding a dummy package component to the first package component. In another embodiment, after etching the portion of the protrusion, the protrusion is recessed below the top surface of the dielectric bond layer. In another embodiment, the method further includes forming a passivation layer over the dielectric bond layer, wherein a portion of the passivation layer directly above the protrusion comprises a second recess. In another embodiment, the method further includes: forming a dielectric layer over the passivation layer; and forming an opening through the dielectric layer, the passivation layer, and the dielectric bond layer to expose the aluminum pad.

In an embodiment, a method includes performing a circuit probe test on a first package component, the first package component comprising an aluminum pad and a sacrificial pad disposed over a substrate, the performing the circuit probe test comprising: physically coupling a probe to the sacrificial pad; and connecting a power or ground signal to the sacrificial pad, wherein after connecting the power or ground signal to the sacrificial pad, the sacrificial pad comprises a protrusion extending upward from a first top surface of the sacrificial pad; forming a first dielectric bond layer over the substrate, the aluminum pad, and the sacrificial pad of the first package component, the first dielectric bond layer comprising a second top surface opposite the substrate; planarizing the first dielectric bond layer, the planarizing exposing the protrusion of the sacrificial pad; and performing a wet etch process to remove an upper portion of the protrusion. In another embodiment, the substrate of the first package component comprises: an interconnect structure electrically connected to the sacrificial pad; a through-silicon via electrically connected to the aluminum pad; and a semiconductor substrate, the through-silicon via extending partially through the semiconductor substrate. In another embodiment, the method further includes: attaching the second top surface of the first dielectric bond layer to a first carrier; thinning the semiconductor substrate to expose the through-silicon via; and forming a second dielectric bond layer and a bond pad adjacent to the first package component, the through-silicon via being electrically interposed between the bond pad and the aluminum pad. In another embodiment, the method further includes hybrid bonding a second package component to the first package component using the second dielectric bond layer and the bond pad. In another embodiment, after connecting the power or ground signal to the sacrificial pad, the sacrificial pad comprises a recess extending downward from the first top surface of the sacrificial pad. In another embodiment, the sacrificial pad comprises aluminum, and wherein performing the wet etch process comprises using etchants being highly selective to etch aluminum over material of the first dielectric bond layer.

In an embodiment, a semiconductor package includes: a semiconductor substrate disposed over a package component; a through-silicon via extending through an entirety of the semiconductor substrate, the through-silicon via being electrically connected to the package component; an interconnect structure disposed over the semiconductor substrate, the interconnect structure electrically connected to integrated circuit devices at a surface of the semiconductor substrate; a first aluminum pad disposed over the semiconductor substrate and electrically connected to the interconnect structure, the first aluminum pad comprising: a top major surface opposite the semiconductor substrate; a first recess extending toward the semiconductor substrate; and a protrusion extending away from the semiconductor substrate; a second aluminum pad disposed over the semiconductor substrate and electrically connected to the through-silicon via; a first dielectric bond layer disposed over and around the first aluminum pad and the second aluminum pad; and a passivation layer disposed over the first aluminum pad and in physical contact with the protrusion. In another embodiment, the semiconductor package further includes a third aluminum pad disposed over the semiconductor substrate and electrically connected to the first aluminum pad and to the interconnect structure. In another embodiment, the semiconductor package further includes an under-bump metallurgy disposed over and in physical contact with the second aluminum pad. In another embodiment, the semiconductor package further includes: a first bonding layer disposed along a bottom surface of the semiconductor substrate; a first bond pad embedded in the first bond layer; a second bonding layer disposed along an upper surface of the package component; and a second bond pad embedded in the second bond layer, the second bond pad physically contacting the first bond pad. In another embodiment, a height of the protrusion above the top major surface is less than a height of the top major surface from a lower major surface. In another embodiment, the passivation layer comprises a second recess directly above the protrusion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a first package component to a first carrier, the first package component comprising:
   an aluminum pad disposed adjacent to a substrate;
   a sacrificial pad disposed adjacent to the substrate, the sacrificial pad comprising a major surface opposite the substrate, a protrusion of the sacrificial pad extending from the major surface; and
   a dielectric bond layer disposed around the aluminum pad and the sacrificial pad;
   attaching a second carrier to the first package component and the first carrier, the first package component being interposed between the first carrier and the second carrier;
   removing the first carrier;
   planarizing the dielectric bond layer to comprise a top surface being coplanar with the protrusion; and
   etching a portion of the protrusion.

2. The method of claim 1 further comprising, before attaching the first package component:
   performing a circuit probe test on the first package component, the performing the circuit probe test comprising forming the protrusion of the sacrificial pad; and
   forming the dielectric bond layer over the protrusion of the sacrificial pad.

3. The method of claim 2, wherein the performing the circuit probe test further comprises:
   electrically connecting a power signal to the sacrificial pad; and
   forming a first recess in the major surface of the sacrificial pad.

4. The method of claim 1 further comprising, before attaching the second carrier, hybrid bonding a second package component to the first package component.

5. The method of claim 4, further comprising, before attaching the second carrier, oxide-oxide bonding a dummy package component to the first package component.

6. The method of claim 1, wherein after etching the portion of the protrusion, the protrusion is recessed below the top surface of the dielectric bond layer.

7. The method of claim 6 further comprising forming a passivation layer over the dielectric bond layer, wherein a portion of the passivation layer directly above the protrusion comprises a second recess.

8. The method of claim 7 further comprising:
   forming a dielectric layer over the passivation layer; and
   forming an opening through the dielectric layer, the passivation layer, and the dielectric bond layer to expose the aluminum pad.

9. A method comprising:
performing a circuit probe test on a first package component, the first package component comprising an aluminum pad and a sacrificial pad disposed over a substrate, the performing the circuit probe test comprising:
  physically coupling a probe to the sacrificial pad; and
  connecting a power or ground signal to the sacrificial pad, wherein after connecting the power or ground signal to the sacrificial pad, the sacrificial pad comprises a protrusion extending upward from a first top surface of the sacrificial pad;
forming a first dielectric bond layer over the substrate, the aluminum pad, and the sacrificial pad of the first package component, the first dielectric bond layer comprising a second top surface opposite the substrate;
planarizing the first dielectric bond layer, the planarizing exposing the protrusion of the sacrificial pad; and
performing a wet etch process to remove an upper portion of the protrusion.

10. The method of claim 9, wherein the substrate of the first package component comprises:
an interconnect structure electrically connected to the sacrificial pad;
a through-silicon via electrically connected to the aluminum pad; and
a semiconductor substrate, the through-silicon via extending partially through the semiconductor substrate.

11. The method of claim 10 further comprising:
attaching the second top surface of the first dielectric bond layer to a first carrier;
thinning the semiconductor substrate to expose the through-silicon via; and
forming a second dielectric bond layer and a bond pad adjacent to the first package component, the through-silicon via being electrically interposed between the bond pad and the aluminum pad.

12. The method of claim 11 further comprising hybrid bonding a second package component to the first package component using the second dielectric bond layer and the bond pad.

13. The method of claim 9, wherein after connecting the power or ground signal to the sacrificial pad, the sacrificial pad comprises a recess extending downward from the first top surface of the sacrificial pad.

14. The method of claim 9, wherein the sacrificial pad comprises aluminum, and wherein performing the wet etch process comprises using etchants being highly selective to etch aluminum over material of the first dielectric bond layer.

15. A method comprising:
forming an integrated circuit over a semiconductor substrate;
forming a first metal pad and a second metal pad over the integrated circuit;
forming a recess and a protrusion in the first metal pad;
depositing a first dielectric bond layer over the first metal pad and the second metal pad;
fusion bonding the first dielectric bond layer to a carrier;
forming a second dielectric bond layer and a bond pad over the semiconductor substrate;
attaching an integrated circuit die to the second dielectric bond layer and the bond pad;
removing the carrier;
planarizing the first dielectric bond layer and the protrusion;
after planarizing the first dielectric bond layer and the protrusion, performing an etch process;
after performing the etch process, forming a passivation layer over the first dielectric bond layer; and
forming an under-bump metallurgy through the passivation layer and electrically connected to the second metal pad.

16. The method of claim 15, wherein performing the etch process comprises using an etchant that is selective to material of the protrusion.

17. The method of claim 15, wherein forming the recess and the protrusion comprises performing a probe test on the integrated circuit.

18. The method of claim 15, wherein planarizing the first dielectric bond layer and the protrusion comprises smearing a portion of the protrusion along a top surface of the first dielectric bond layer.

19. The method of claim 18, wherein performing the etch process comprises recessing the protrusion below the top surface of the first dielectric bond layer.

20. The method of claim 19, wherein performing the etch process comprises removing the portion of the protrusion.

* * * * *